METHOD OF AUTOMATICALLY ETCHING AN ESAKI DIODE

Filed June 13, 1960 3 Sheets-Sheet 1

INVENTOR
EDWARD M. DAVIS JR.

BY Everett A. Gartrell
ATTORNEY

METHOD OF AUTOMATICALLY ETCHING AN ESAKI DIODE

Filed June 13, 1960 3 Sheets-Sheet 3

United States Patent Office 3,196,094
Patented July 20, 1965

3,196,094
METHOD OF AUTOMATICALLY ETCHING AN ESAKI DIODE

Edward M. Davis, Jr., Poughkeepsie, N.Y., assignor to International Business Machines Corporation, New York, N.Y., a corporation of New York Filed June 13, 1960, Ser. No. 35,677
4 Claims. (Cl. 204—143)

The present invention is directed to methods and apparatus for etching low impedance semiconductor diode-type devices so as to obtain therefor substantially uniform electrical characteristics. More particularly the invention relates to methods and apparatus for electrolytically etching Esaki or tunnel diode-type devices in order consistently to secure therefor nearly identical electrical characteristics such as their peak currents or peak-to-valley current ratios.

The Esaki diode has attracted a widespread attention in the semiconductor art second only to that received by the transistor when the latter was announced. This diode appears to be very promising for many applications because of its negative resistance characteristic, simplicity, excellent high frequency response, low noise figure, low power requirements and ability to work well at extreme temperatures.

An Esaki diode device is ordinarily fabricated by doping very heavily a semiconductor wafer with an N-type impurity such as arsenic or with a P-type impurity such as gallium. Semiconductor materials such as germanium, silicon, silicon-carbide, and intermetallic compounds such as gallium arsenide or indium antimonide may be employed as the wafer. In order to reduce series resistance, the wafer is usually very thin, having a thickness of say from 1 to 2 mils. A heavily doped pellet of a P-type impurity such as gallium, indium, aluminum, or boron is alloyed to an N-type wafer to form a PN junction which has a thickness of about 75 angstroms. The impedance of this junction is very low, the negative resistance region being in the general range of 150 ohms divided by the peak current in milliamperes. Subsequently the structure thus formed is etched electrolytically to expose the junction by removing short-circuiting material from about that junction and to secure an Esaki diode with certain desirable electrical characteristics. The resultant device has a generally N-shape current-voltage characteristic such that when a forward bias on the semiconductor is increased, the current rises steeply to a peak and then falls abruptly after which it flattens out into a rather broad valley before rising once again. This etching operation serves to modify the generally N-shape current-voltage characteristic of the Esaki diode device by undercutting or reducing the area of the PN junction, thus reducing the peak-current carrying capacity of the device. Heretofore, the electrolytic etching operation was conducted for a given interval or intervals of time. Unfortunately, the diodes etched in this manner have been subject to a large spread in the values of their peak currents and their peak-to-valley current ratios. For some purposes, such as in computer applications, it is desirable to hold the peak currents of Esaki diodes to a low tolerance such as 5%. Heretofore it was necessary to make a careful selection of the etched Esaki diodes by way of electrical tests since only a small percentage thereof were capable of meeting the rigorous 5% tolerance requirement. Manifestly, such a procedure was time consuming and the low yield of diodes with relatively uniform characteristics made the etching and selection procedure costly. A 20% tolerance in peak currents is typical of that established for Esaki diode devices etched by prior-art procedures.

It is an object of the present invention, therefore, to provide a new and improved method of etching low impedance semiconductor diode-type devices to assure substantially uniform electrical characteristics therefor.

It is another object of the invention to provide a new and improved method of electrolytically etching Esaki diode-type devices which assures production of the latter with substantially uniform values of peak currents.

It is a further object of the invention to provide a new and improved method of electrically etching Esaki diode-type devices to assure that the peak currents thereof are within at least a 5% tolerance.

It is also an object of the present invention to provide a new and improved method of electrolytically etching Esaki diode devices having peak currents which may be less than 25 milliamperes.

It is yet another object of the invention to provide a new and improved method of etching Esaki diode-type devices having peak currents which may be less than or greater than 25 milliamperes.

It is an additional object of the invention to provide a new and improved method of electrolytically etching Esaki diode devices which automatically discontinues the etching when the device has acquired a predetermined value of peak current.

It is also an object of the invention to provide a new and improved apparatus for electrolytically etching Esaki diode-type devices to assure that they have substantially uniform electrical characteristics.

It is another object of the invention to provide a new and improved apparatus for automatically terminating the electrolytic etching of Esaki diode-type devices when a predetermined peak current through the device is attained.

It is a further object of the invention to provide a new etching procedure for improving the yield of quality Esaki diode devices.

In accordance with a particular form of the invention, the apparatus for etching an Esaki diode device with an electrolyte having an impedance substantially greater than the conductive impedance of that device in its negative resistance region to reduce the area of its PN junction and concurrently to reduce to a predetermined value the peak current carrying capacity of the device between the positive and negative slopes of its N-shaped current-voltage characteristic curve, comprises means for passing through the PN junction of the aforesaid device in its forward direction of conductivity a unidirectional current which has a peak value substantially equal to the aforesaid predetermined value and which operates to develop a control voltage across the diode. The apparatus also includes means for subjecting the exposed portion of the junction and the region of the device thereabout to the jet of an electrolyte. The apparatus further includes means for simultaneously passing a second current in the anodic direction between the device and the electrolyte to etch material from the device and reduce the area of its junction and concurrently to reduce the peak current carrying capacity to the aforesaid predetermined value, whereby the operating point of the device shifts on its characteristic curve thereby causing an amplitude shift in the control voltage across the diode. The etching apparatus still further includes means for utilizing the amplitude shift in the control voltage to terminate automatically the second current and the aforesaid jet of an electrolyte.

Also in accordance with the invention, the method of etching an Esaki diode device to reduce the area of its PN junction and concurrently to reduce to a predetermined value the peak current carrying capacity of the device between the positive and negative slopes of the N-shaped current-voltage characteristic curve comprises passing through the aforesaid PN junction of the device in its forward direction of conductivity a unidirectional current which has a peak value substantially equal to the aforesaid predetermined value and which operates to develop a control voltage across the diode. The method further includes subjecting the exposed portion of the junction and the region of the device thereabout to the jet of an electrolyte having a resistance which is substantially greater than the conductive impedance of the device in its negative resistance region. The method additionally includes passing a second current in the anodizing direction between the device and the electrolyte to etch material from the device and reduce the area of its junction and concurrently to reduce the peak current carrying capacity to the aforesaid predetermined value, whereby the operating point of the device shifts on its characteristic curve thereby causing an amplitude shift in the control voltage across the diode. The method still further includes utilizing the amplitude shift in the control voltage to terminate automatically the second current and the aforesaid jet of the electrolyte.

The foregoing and other objects, features and advantages of the invention will be apparent from the following more particular description of the preferred embodiments of the invention, as illustrated in the accompanying drawings.

DESCRIPTION OF FIGURE 1 APPARATUS

Figure 1:
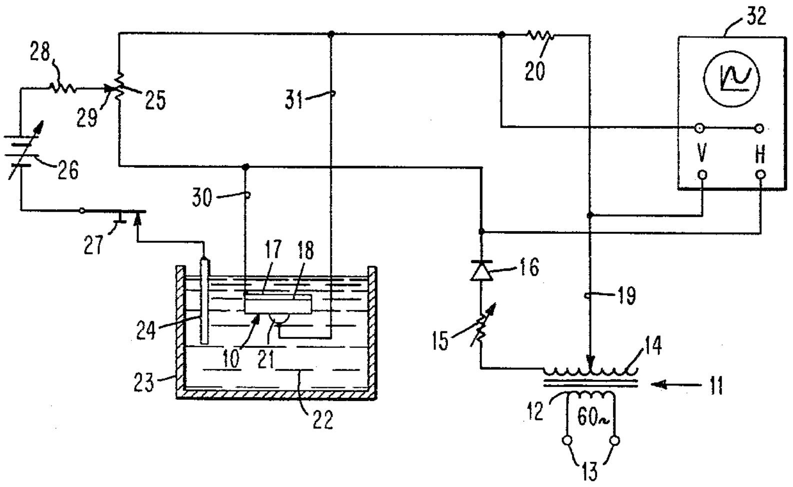
FIGURE 1 is a circuit diagram representing an apparatus in accordance with a particular form of the invention for etching a low impedance semiconductor device such as Esaki diode.

Referring now to FIGURE 1 of the drawings, the apparatus for etching a low impedance semiconductor device such as an Esaki diode 10 comprises means for passing a first current through the diode. This means includes a transformer 11 having a primary winding 12 for connection through a pair of terminals of 13, 13 to a suitable alternating-current source and having a secondary winding 14, one terminal of the latter being connected through an adjustable resistor 15, a diode rectifier 16, and a lead 30 to the electrode 17 associated with the N-type region 18 of the Esaki diode 10. An adjustable tap 19 associated with the secondary winding 14 of transformer 11 is connected through a resistor 20 and a lead 31 to the other electrode 21 associated with the alloyed P-type region of the diode 10.

The apparatus for etching the diode 10 also comprises means, including an electrolyte 22 having a resistance which is substantially greater than the conductive impedance of the diode, for passing a second current in the anodizing direction between the diode and the electrolyte to etch material from the diode and thereby modify an electrical characteristic related to the first-mentioned current. The means under consideration includes a container 23 for the electrolyte, a cathode 24 of a suitable inert material such as stainless steel disposed in the electrolyte, and means for completing an etching circuit between the cathode and the diode. To that end, a resistor 25 having an impedance level much greater than that of the Esaki diode 10 is connected between the two electrodes of the diode, and the negative terminal of an adjustable unidirectional current source of battery 26 is connected through a single pole switch 27 to the cathode 24 while its positive terminal is connected through a resistor 28 to an adjustable tap 29 connected to the resistor 25. The terminals of the resistor 25 are, in turn, connected to the electrodes 17 and 18 of the Esaki diode through conductors including the leads 30 and 31. The electrolyte 22 preferably comprises an alkaline solution such as one containing 2% of sodium hydroxide by weight, which solution has a resistance substantially greater than the impedance of the diode 10 so as not to short circuit the diode. By impedance of the diode is meant its conductive impedance when operating in its negative resistance region. The described solution has proved to be desirable for etching Esaki diodes to produce peak currents within a 5% tolerance. For closer tolerances such as 1%, a solution containing 0.1% of sodium hydroxide by weight has been found to be more appropriate.

The etching apparatus of the present invention also includes measuring means coupled to the Esaki diode during the etching for deriving an effect representative of the modification of the electrical characteristic by that etching operation. This means comprises a conventional curve tracer such as a cathode-ray oscilloscope 32 which has its horizontal deflecting electrodes or system coupled to the electrodes 17 and 21 of the Esaki diode 10 and has its vertical deflecting system or electrodes coupled across the resistor 20 so that the oscilloscope is effectively responsive to the first current through the diode supplied from the transformer 11 for deriving an effect indicative of when the characteristic of the diode has a desired value, as will be explained subsequently.

EXPLANATION OF OPERATION OF FIGURE 1 APPARATUS

Figure 2:
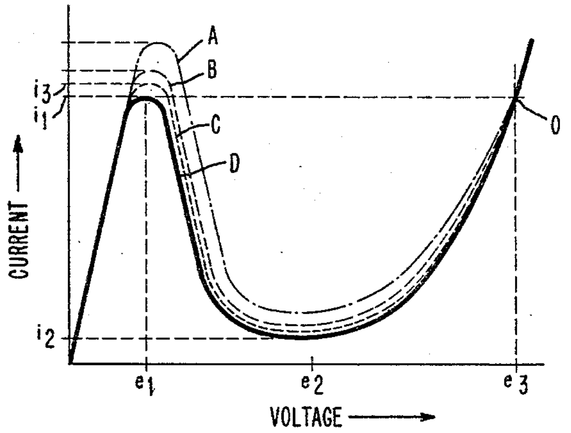
FIGURE 2 is a family of curves used in explaining the operation of the apparatus of FIGURE 1.

In considering the operation of the FIGURE 1 apparatus, it will be assumed initially that the switch 27 is closed and that the battery 26 and the tap 29 on the resistor 25 have been adjusted so that satisfactory and substantially equal values of etching current supplied by the battery flow through the leads 30 and 31 to the electrodes 17 and 21 of the Esaki diode 10. It will also be assumed that the resistor 15 and the tap 19 on the secondary winding 14 of transformer 11 have been adjusted so that a suitable value of pulsating unidirectional current supplied by the transformer 11 and the rectifier 16 flows from tap 19 through the resistor 20, lead 31, to the diode 10 via electrode 21, and from the Esaki diode via electrode 17 and the lead 30 back to the diode 16, thus permitting the oscilloscope 32 to trace or display on its screen the current-voltage curve of the Esaki diode. In this display, current is represented along the axis of ordinates and voltage appears along the axis of abscissae in the well-known manner. The flow of etching current in the circuit from the positive terminal of the battery 26 through the resistor 28, the tap 29, the two portions of the resistor 25, the leads 30 and 31 to the diode 10, the electrolyte 22, the cathode 24, switch 27 and thence back to the negative terminal of the battery will be effective to remove undesirable short circuiting and low resistance material from about the PN junction. When the junction is initially exposed, the current-voltage curve of the Esaki diode will resemble that represented in Curve A of FIGURE 2 by the dash-dot line. It will be noted that this characteristic curve is generally N-shaped, the current rising steeply to a peak (which for our present consideration represents too high a value) and then falling abruptly, after which its flattens out into a rather broad valley before rising abruptly again. The region of the curve which follows the peak and has the negative slope is the negative-resistance region of the characteristic.

As the etching of the Esaki diode 10 continues, it is reduced in size, and this in turn reduces its peak-current carrying capacity. Accordingly, the peak current and the valley current progressively diminish in the manner represented by the successive Curves B, C and D. The solid-line Curve D represents the desired current-voltage characteristic which is being sought for the Esaki diode being etched. Current $i_1$ represents the desired value of peak current which is observed on the screen of the oscilloscope at potential $e_1$, and the current $i_2$ is the desired valley current occurring at voltage $e_2$. It will be understood that the peak-to-valley current ratio $i_1/i_2$ will vary with the design of the particular Esaki diode and with the materials employed therein. Germanium Esaki diodes may have current ratios in a range such as from 2:1 to 15:1 and peak currents from about 50 microamperes to 10 amperes while the voltages corresponding to their peak currents may fall within the range of 0.3 to 0.5 volt. Silicon Esaki diodes, on the other hand, may have peak-to-valley current ratios of from 3:1 to 4:1 and peak currents of from 16 milliamperes to 0.5 ampere while the corresponding voltage levels may be within the range of 0.6 to 0.75 volt. When the operator has observed that the Esaki diode being etched has the desired electrical characteristic, the switch 27 is opened to discontinue the etching and another diode is substituted for the one which has been etched. The etched diode subsequently receives suitable washing and rinsing operations in accordance with techniques well known in the art.

Additional diodes are monitored as they are being simultaneously etched in the manner explained above. When a large group of Esaki diodes has been made from the same materials to prescribed tolerances, prior to etching, this group may thereafter be etched with the apparatus described above to produce consistently a correspondingly lareg group of diodes having substantially identical electrical characteristics. Accordingly, the difficult problem of securing uniform electrical characteristics in the field of Esaki diode fabrication, which heretofore had not been solved, has been overcome by the procedure employing the apparatus described above. Thus a high yield of Esaki diodes of uniformly high quality is assured.

Esaki diodes made by alloying 5 mil spheres of an indium-gallium alloy to an N-type germanium wafer having a diameter of 26 mils and a thickness of 7 mils have been successfully etched to secure any prescribed peak current between 100 microamperes and 50 milliamperes by the apparatus and procedure described above. A solution containing 2% of sodium hydroxide by weight was employed, the etching time was about 30 seconds, and the tolerance in the value of peak current was 5%. The yield, i.e. number of diodes fabricated divided into the number of diodes meeting the above mentioned specifications, has been better than 90%.

From the foregoing description, it will be seen that a relatively steady unidirectional current which is supplied by the battery 26 is employed in the etching operation. Its use permits the employment of a relatively simple circuit which has proved to be very effective in etching Esaki diodes having peak currents greater than 25 milliamperes. When those peak currents are less than 25 milliamperes, the etching currents are, in general, equal to or much greater than the current supplied by the transformer 11 and the rectifier 16 for viewing the Esaki diode characteristics. Accordingly, it becomes difficult to balance to the required accuracy the flow of etching currents to each of the electrodes of the Esaki diode by means of an adjustment of the tap 29 on the resistor 25. To avoid this difficulty, a modified form of the etching apparatus of FIGURE 1, which is to be described hereinafter, may be employed.

DESCRIPTION OF ETCHING APPARATUS OF FIGURE 3

Figure 3:
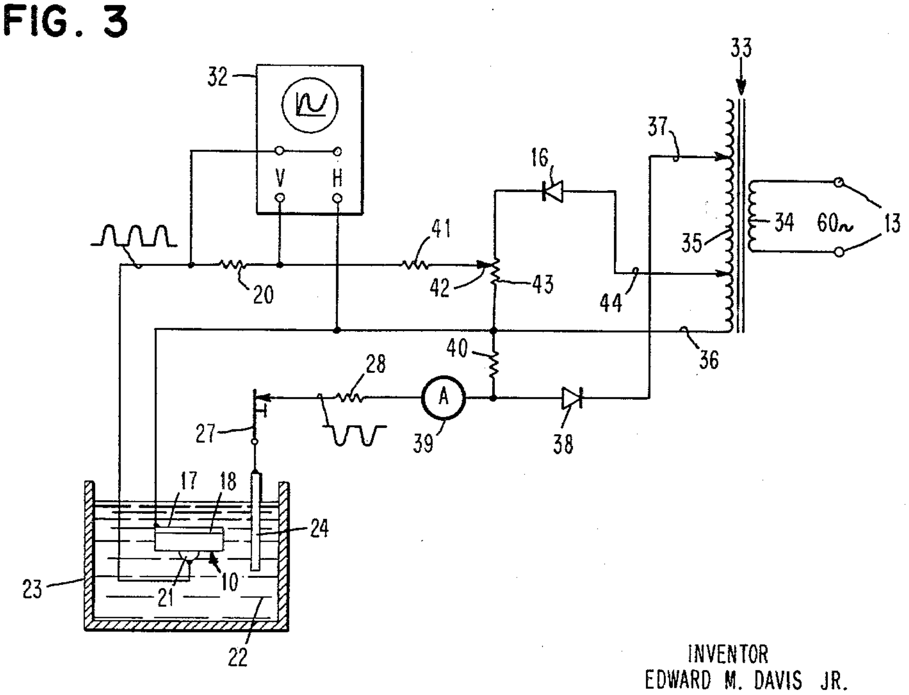
FIGURE 3 is a circuit diagram of a modified apparatus for etching an Esaki diode device.

Referring now to FIGURE 3 of the drawings, the apparatus there represented is similar to the apparatus of FIGURE 1. Accordingly, corresponding elements are designated by the same reference numerals. Instead of using a relatively constant unidirectional current for etching as in FIGURE 1, the FIGURE 3 embodiment of the invention employs a pulsating unidirectional current which is effective to etch the Esaki diode during positive half cycles of the supplied alternating current wave, while the oscilloscope 32 displays the current-voltage characteristic of the diode during the negative half cycles of that wave. To achieve this, the etching apparatus includes a transformer 33 having its primary winding 34 connected to a pair of alternating-current supply input terminals 13, 13 and having its tapped secondary winding 35 connected in a manner to be described. The circuit to be desired hereinafter effectively constitutes the etching circuit of the apparatus. A fixed terminal 36 of the secondary winding 35 is connected directly to the electrode 17 of the Esaki diode 10 while an adjustable tap 37 at the other end of that winding is connected through a diode rectifier 38, a milliammeter 39, a resistor 28, and a switch 27 to the cathode 24 which is immersed in the electrolyte 22 along with the Esaki diode. The rectifier 38 is poled to conduct when the tap 36 swings negatively. A resistor 40 is connected between the anode of a rectifier 38 and the fixed terminal 36 of the secondary winding 35 of the transformer. The terminal 21 of the Esaki diode 10 is connected through resistors 20 and 41, a tap 42, and a selected portion of the resistor 43 to the terminal 36. The tap 42 is similar to the tap 25 on the resistor of FIGURE 1 and is adjustable so that approximately equal amounts of etching current flow from the electrodes 17 and 21 of the Esaki diode 10 through the etching solution to the cathode 24.

The oscilloscope 32 is connected to the resistor 20 and to the electrodes of the Esaki diode in the same manner described in connection with FIGURE 1 and will not be repeated. The means for passing a current through the Esaki diode to be used to reveal the progress of the etching operation on the diode includes the terminal 36 and the connections to the electrode 17 of the diode, and further includes an adjustable tap 44 on the secondary winding 35 which is connected through the diode rectifier 16, the upper portion of the resistor 43, the tap 42, resistors 41 and 20, and the connection from the latter to the terminal 21 of the Esaki diode. The rectifier 16 is poled to conduct when the tap 44 on the transformer winding 35 is positive with respect to the terminal 36 thereof.

EXPLANATION OF OPERATION OF ETCHING APPARATUS OF FIGURE 3

Considering now the operation of the etching apparatus of FIGURE 3, etching current flows from terminal 36 through the paths from that terminal to the electrodes 17 and 21 of the Esaki diode and from there to the cathode 24. The first of these paths is through the direct connection between the terminal 36 and the electrode 17, while the second path is from terminal 36 through a portion of resistor 43 to the tap 42 and then through the resistors 41 and 20 to the electrode 21. The etching circuit is completed from the cathode 24 through the switch 27, the resistor 28, the meter 39, and the rectifier 38 to the tap 37, the latter being momentarily negative when the terminal 36 swings positively. During the same positive half cycle under consideration, current also flows from the terminal 36 through the resistor 40 and the rectifier 38 to the tap 37 to assure the desired division of current mentioned in the two current paths to the Esaki diode 10. However, current does not flow during this positive half cycle through the rectifier 16 because of its polarity. During the succeeding half cycle, terminal 36 swings negatively while taps 44 and 37 swing in a positive direction. Rectifier 38 is so poled that current cannot flow through it from resistor 40 or from the cathode 24 via resistor 28 and the meter 39. Accordingly, the flow of etching current through the electrolyte from the Esaki diode 10 to the cathode 24 is then interrupted.

At this time, however, one is able to view the current-voltage characteristic of the Esaki diode during this half cycle since the diode rectifier 16 is now properly poled to conduct. Since the tap 44 is momentarily more positive than the terminal 36, the current flows through the rectifier 16 and resistor 43 back to terminal 36, and also flows as a measuring or viewing current from tap 42 through resistors 41 and 20 to electrode 21, and from the latter through the Esaki diode to electrode 17 and back to terminal 36. The oscilloscope 32 is connected so that it responds in the well-known manner to trace the current-voltage characteristic of the Esaki diode on its screen, thereby providing during alternate half cycles of the wave applied to the apparatus a visual indication of the progress of the etching. Alternate etching and observation continues during succeeding positive and negative half cycles of applied energy. When the peak current of the Esaki diode reaches a desired level, such as the level $i_1$ represented in FIGURE 2, the operator discontinues the etching and viewing operation by opening the switch 27 and replacing the Esaki diode with another that is to receive the etching treatment. The time separation of the functions of etching and viewing eliminates the need for an accurate current-balancing operation for the two etching paths to the Esaki diodes as in FIGURE 1 and also provides excellent results in connection with the etching of low current Esaki diodes, such as those which translate peak currents less than 25 milliamperes, as well as with diodes having larger peak current-carrying capacities.

DESCRIPTION OF ETCHING APPARATUS OF FIGURE 4

Figure 4:
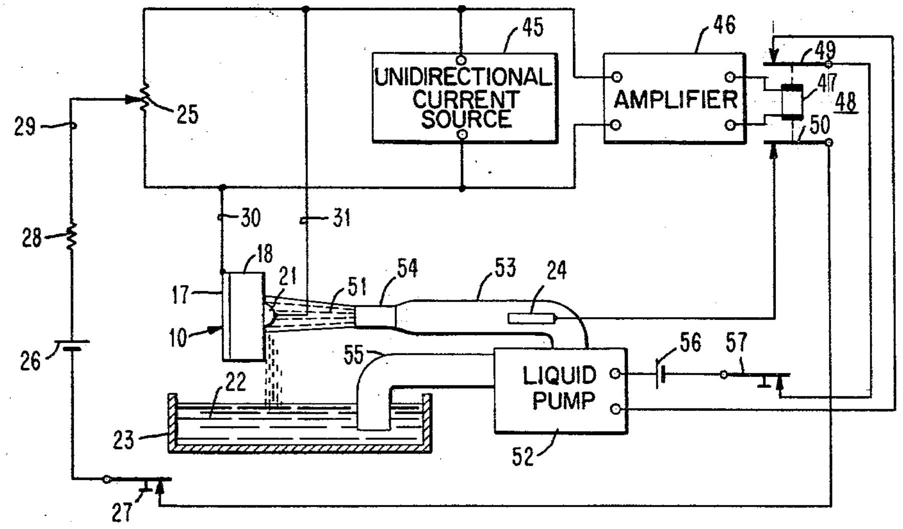
FIGURE 4 represents another apparatus in accordance with the invention for etching an Esaki diode device.

The FIGURE 4 apparatus is similar to the etching apparatus of FIGURE 1 and corresponding elements are designated by the same reference numerals. A unidirectional source 45 is connected by leads 30 and 31 to the electrodes 17 and 21 for supplying to the Esaki diode a steady unidirectional current $i_3$ (see FIGURE 2) substantially equal to the desired peak current of the Esaki diode. A voltage amplifier 46 of conventional construction has its input terminals connected to the source 45 and its output terminals connected to winding 47 of a relay 48. The latter has a pair of normally closed contacts associated with armatures 49 and 50. Instead of immersing the Esaki diode in an electrolytic bath as FIGURE 1, a jet etching technique is employed to obtain the desired electrical characteristic. To that end, a jet 51 of the electrolyte is forced by a liquid pump 52 over the cathode 24 resting in a conduit 53 and then through a nozzle 54 into engagement with the electrode 21 adjoining the PN junction of the Esaki diode. A pump intake 55 is disposed in the etching solution 22 in the container 23.

The apparatus of FIGURE 4 differs from that of FIGURES 1 and 3 in that the etching operation is discontinued automatically and does not require an observer continuously to monitor the progress of the etching operation on an oscilloscope. To that end, an energizing source such as a battery 56 is connected to a motor for the pump 52 through a single-pole switch 57 and the normally closed contact of the relay 48 associated with the armature 49. The cathode 24 in the electrolyte in conduit 53 of the jet etching system is connected in series with the normally closed contact associated with the armature 50, which in turn is connected through switch 27, battery 26, resistor 28, tap 29, and the two branches of the resistor 25 to the leads 30 and 31 connected to the electrodes 17 and 21 of the Esaki diode. The jet 51 completes the etching circuit to the cathode 24.

EXPLANATION OF OPERATION OF FIGURE 4 ETCHING APPARATUS

In considering the etching operation of the apparatus of FIGURE 4, it will be assumed that various switches have been closed to start the pump and to complete the etching circuit and that proper adjustment of tap 29 has been made. In the manner well understood in the art, jet etching of the Esaki diode takes place to remove material from about the region of the PN junction, thereby progressively altering the current-voltage characteristic of the diode as represented by Curves A, B, C and D of FIGURE 2. The unidirectional current source 45 translates through the diode 10 a current corresponding to the current level $i_3$ associated with the dotted-line Curve C, the voltage corresponding to the current level being $e_1$. As the erosion of the Esaki diode continues so that its peak current drops below the peak-current level $i_3$ represented by Curve C to the level $i_1$ of Curve D, the operating point of the Esaki diode switches suddenly to point O on the right hand portion of the Curve D, and there is developed between the electrodes 17 and 21 of the Esaki diode a relatively large voltage $e_3$. This change in operating point as a result of the application to the diode of the current which exceeds the peak current of the Esaki diode is well known in the art and need not be mentioned further. Amplifier 46 augments this voltage swing sufficiently to actuate the relay 48, thereby opening the normally closed switch contacts associated with armatures 49 and 50. This in turn opens the electrical circuit for the pump 52 and the diode etching circuit, thus automatically terminating the etching when the desired electrical characteristic is attained.

DESCRIPTION OF APPARATUS OF FIGURE 5

Figure 5:
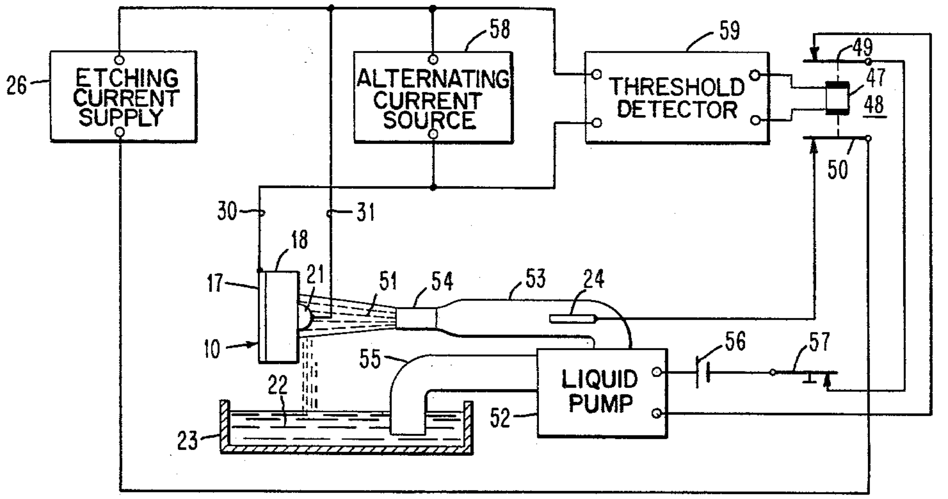
FIGURE 5 represents a modification of the apparatus of FIGURE 4.

In FIGURE 5 there is represented an etching apparatus which is similar to that of FIGURE 4, corresponding elements of the two units being represented by the same reference numerals. For convenience the etching current supply has been represented as unit 26. This supply may be unidirectional as in FIGURE 1 or a pulsating supply as shown in FIGURE 3. The apparatus of FIGURE 5 differs from that of FIGURE 4 in that it employs an alternating-current source 58 and a threshold detector 59 in lieu of the unidirectional source 45 and the amplifier 46. Detector 59 is a conventional voltage-responsive device such as a biased amplifier or Schmidt trigger circuit which develops an output signal only when an applied voltage exceeds a predetermined level.

EXPLANATION OF OPERATION OF FIGURE 5 APPARATUS

Figure 6:
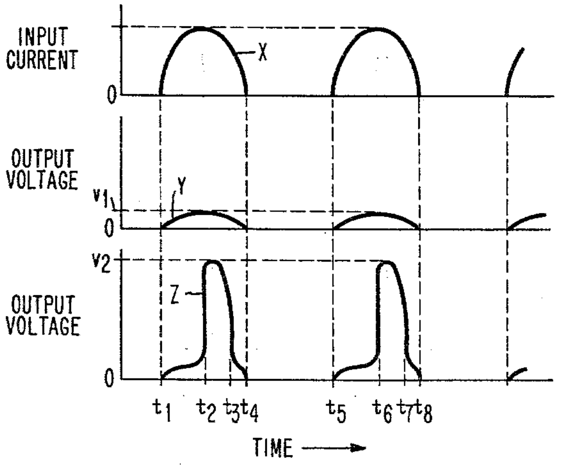
FIGURE 6 is another family of curves employed in explaining the operation of the FIGURE 5 apparatus.

Curve X of FIGURE 6 represents the waveform of recurrent unidirectional pulses of current which are translated by the Esaki diode 10 during the spaced intervals $t_1$–$t_4$ and $t_5$–$t_8$ as the diode is being etched. Prior to attaining the desired peak current, such as that represented by Curve D of FIGURE 2, the output voltage pulses appearing between the electrodes 17 and 21 of the Esaki diode have the waveform represented by Curve Y of FIGURE 6. It will be seen that this voltage has the relatively low magnitude $V_1$. When the peak current of the diode reaches the desired predetermined value after sufficient etching, the voltage developed across the Esaki diode increases suddenly to the value $V_2$ as represented by the spikes during the intervals $t_2$–$t_3$ and $t_6$–$t_7$ in Curve Z. These increased voltage pulses exceed the threshold level established for the detector 59, and the latter develops an output voltage which is effective to actuate the relay 48 and discontinue the etching operation in a manner previously explained. Thus the threshold detector 59 and the relay 48 constitute a means responsive to the increase in the voltage developed across the Esaki diode 10 when its peak current reaches a desired value for the purpose of terminating the etching operation.

While the invention has been particularly shown and described with reference to preferred embodiments thereof, it will be understood by those skilled in the art that the foregoing and other changes in form and details may be made therein without departing from the spirit and scope of the invention.

What is claimed is:

1. The method of etching an Esaki diode device to reduce the area of its PN junction and concurrently to reduce to a predetermined value the peak current carrying capacity of said device between the positive and negative slopes of its N-shaped current-voltage characteristic curve where the diode exhibits a conductive impedance in the negative resistance region comprising:

passing through said PN junction of said device in its forward direction of conductivity a unidirectional current which has a peak value substantially equal to said predetermined value, said unidirectional current being operative to establish across the diode a control voltage;

subjecting the exposed portion of said junction and the region of said device thereabout to the jet of an electrolyte having a resistance which is substantially greater than said conductive impedance of said device in its negative resistance region;

simultaneously passing a second current through said junction in the etching direction between said device and said jet of electrolyte to etch material from said device and reduce the area of said junction and concurrently to reduce said peak current carrying capacity to said predetermined value, whereby said control voltage exhibits an amplitude shift; and utilizing said amplitude shift automatically to terminate said second current and said jet of said electrolyte.

2. The method of etching an Esaki diode device to reduce the area of its PN junction and concurrently to reduce to a predetermined value the peak current carrying capacity of said device between the positive and negative slopes of its N-shaped current-voltage characteristic curve where the diode exhibits a conductive impedance in the negative resistance region comprising:

passing through said PN junction of said device in its forward direction of conductivity a pulsating unidirectional current which has a peak value substantially equal to said predetermined value, said unidirectional current being operative to establish across the diode a control voltage;

subjecting the exposed portion of said junction and the region of said device thereabout to the jet of an electrolyte having a resistance which is substantially greater than said conductive impedance of said device in its negative resistance region;

simultaneously passing a continuous second current through said junction in the etching direction between said device and said jet of electrolyte to etch material from said device and reduce the area of said junction and concurrently to reduce said peak current carrying capacity to said predetermined value, whereby said control voltage exhibits an amplitude shift; and utilizing said amplitude shift automatically to terminate said second current and said jet of said electrolyte.

3. The method of etching an Esaki diode device to reduce the area of its PN junction and concurrently to reduce to a predetermined value the peak current carrying capacity of said device between the positive and negative slopes of its N-shaped current-voltage characteristic curve where the diode exhibits a conductive impedance in the negative resistance region comprising:

passing through said PN junction of said device in its forward direction of conductivity a pulsating unidirectional current which has a peak value substantially equal to said predetermined value, said unidirectional current being operative to establish across the diode a control voltage;

subjecting the exposed portion of said junction and the region of said device thereabout to the jet of an electrolyte having a resistance which is substantially greater than said conductive impedance of said device in its negative resistance region;

simultaneously passing a second pulsating current through said junction in the etching direction between said device and said jet of electrolyte to etch material from said device and reduce the area of said junction and concurrently to reduce said peak current carrying capacity to said predetermined value, whereby said control voltage exhibits an amplitude shift; and utilizing said amplitude shift automatically to terminate said second current and said jet of said electrolyte.

4. The method of etching an Esaki diode device having two terminals to reduce the area of its PN junction and concurrently to reduce to a predetermined value the peak current carrying capacity of said device between the positive and negative slopes of its N-shaped current-voltage characteristic curve where the diode exhibits a conductive impedance in the negative resistance region comprising:

passing through said PN junction of said device in its forward direction of conductivity a unidirectional current which has a peak value substantially equal to said predetermined value, said unidirectional current being operative to establish across the diode a control voltage;

subjecting the exposed portion of said junction and the region of said device thereabout to the jet of an electrolyte having a resistance which is substantially greater than said conductive impedance of said device in its negative resistance region;

simultaneously passing equal amounts of a second current in the etching direction between said two terminals of said device and said jet of said electrolyte to etch material from said device and reduce the area of said junction and concurrently to reduce said peak current carrying capacity to said predetermined value, whereby said control voltage exhibits an amplitude shift; and utilizing said amplitude shift automatically to terminate said second current and said jet of said electrolyte.

References Cited by the Examiner

UNITED STATES PATENTS

| | | | |
|---|---|---|---|
| 2,505,370 | 4/50 | Sykes | 204—192 |
| 2,765,765 | 10/56 | Bigler | 204—192 |
| 2,783,197 | 2/57 | Herbert | 204—143 |
| 2,875,141 | 2/59 | Noyce | 204—143 |
| 2,913,383 | 11/59 | Topfer | 204—143 |
| 2,940,024 | 6/60 | Kurshan | 204—143 |
| 2,963,411 | 12/60 | Scott | 204—143 |
| 2,975,342 | 3/61 | Rediker | 204—143 |
| 2,979,444 | 4/61 | Tiley | 204—143 |
| 3,081,418 | 3/63 | Manintveld et al. | 204—143 |

FOREIGN PATENTS

| | | |
|---|---|---|
| 761,795 | 11/56 | Great Britain. |

JOHN H. MACK, *Primary Examiner.*